United States Patent
Hiroshima et al.

(10) Patent No.: US 6,331,780 B1
(45) Date of Patent: Dec. 18, 2001

(54) STATIC CAPACITANCE-TO-VOLTAGE CONVERTER AND CONVERTING METHOD

(75) Inventors: Tatsuo Hiroshima; Koichi Nakano; Muneo Harada; Toshiyuki Matsumoto, all of Hyogo-ken; Yoshihiro Hirota, Kyoto, all of (JP)

(73) Assignee: Sumitomo Metal Industries Ltd., Osaka (JP)

( * ) Notice: Subject to any disclaimer, the term of this patent is extended or adjusted under 35 U.S.C. 154(b) by 0 days.

(21) Appl. No.: 09/381,780

(22) PCT Filed: Jan. 22, 1999

(86) PCT No.: PCT/JP99/00229

§ 371 Date: Sep. 23, 1999

§ 102(e) Date: Sep. 23, 1999

(87) PCT Pub. No.: WO99/38019

PCT Pub. Date: Jul. 29, 1999

(30) Foreign Application Priority Data

| Jan. 23, 1998 | (JP) | 10-11581 |
| Feb. 6, 1998 | (JP) | 10-26240 |
| Dec. 9, 1998 | (JP) | 10-350021 |

(51) Int. Cl.$^7$ .................................................. G01R 27/26
(52) U.S. Cl. ...................... 324/684; 324/658; 324/683; 324/686
(58) Field of Search .................... 324/684, 686, 324/622, 658, 665, 672, 683, 688, 457, 458

(56) References Cited

U.S. PATENT DOCUMENTS

| 3,753,373 | * | 8/1973 | Brown | 73/753 |
| 3,778,707 | * | 12/1973 | Vogel | 324/659 |
| 4,797,620 | | 1/1989 | Williams . | |
| 4,918,376 | | 4/1990 | Poduje et al. . | |
| 5,136,262 | * | 8/1992 | Spencer | 331/135 |

FOREIGN PATENT DOCUMENTS

| 0 500 203A1 | 8/1992 | (EP) . |
| 2 020 816A | 11/1979 | (GB) . |
| 55-146058 | 11/1980 | (JP) . |
| 09280806 | * 10/1997 | (JP) . |

OTHER PUBLICATIONS

Monticelli et al. "Op–amp circuit measures diode–junction capacitance" Electronics Week, vol. 48, No. 14, Jul. 10, 1975, pp. 112–113.

* cited by examiner

Primary Examiner—Safet Metjahic
Assistant Examiner—Anjan K Deb
(74) Attorney, Agent, or Firm—Barnes & Thornburg

(57) ABSTRACT

A static capacitance-to-voltage converter is capable of converting a static capacitance into a voltage without suffering from a stray capacitance formed between a signal and a shielding line or a stray capacitance formed between an exposed portion of the signal line and its surroundings. The static capacitance-to-voltage converter is formed of an operational amplifier placed in an imaginary short-circuit state between an inverting input and a non-inverting input thereof; a signal line having one end connected to the inverting input and the other end capable of being connected to a static capacitance; a shielding line surrounding the signal line and connected to the non-inverting input; an alternating current signal generator for applying the non-inverting input with an alternating current signal; and zero adjusters for adjusting the output of the static capacitance-to-voltage converter to minimum when no static capacitance is connected to the signal line.

24 Claims, 11 Drawing Sheets

STATIC CAPACITANCE-TO-VOLTAGE CONVERTER AND CONVERTING METHOD

RELATED APPLICATION

The present application is a national stage of International Application Ser. No. PCT/JP99/00229, filed Jan. 22, 1999.

TECHNICAL FIELD

The present invention relates to a static capacitance-to-voltage converter and an associated converting method which are capable of highly accurate conversion of a static capacitance into a corresponding voltage by eliminating the influence of a stray capacitance occurring on a signal line for connecting the static capacitance to an operational amplifier.

BACKGROUND ART

FIG. 1 generally illustrates the configuration of a static capacitance-to-voltage converter described in Laid-open Japanese Patent Application No. 61-1457. This static capacitance-to-voltage converter has been proposed to solve a problem of the prior art which suffers from the inability of accurate voltage conversion due to the fact that a stray capacitance of a cable used to connect an unknown static capacitance is superimposed on the unknown static capacitance, and that these static capacitances may vary due to movements and bending of the cable or the like. As illustrated in FIG. 1, an unknown capacitance Cx is connected between an alternating current (AC) signal generator OS and an operational amplifier OP with connection cables covered with shielding lines s to reduce the influence of stray capacitances Cs1, Cs2, Cs3. Specifically, an output and an inverting input of the operational amplifier OP are connected through a feedback circuit formed of a parallel circuit including a resistor Rf and a capacitor Cf. The unknown capacitance Cs has one end connected to the inverting terminal of the operational amplifier OP through a shielding line s, and the other end connected to the AC signal generator OS through another shielding line s. Both of the shielding lines and a non-inverting input of the operational amplifier OP are grounded.

With the configuration described above, since substantially no voltage difference exists between the two ends of the unknown capacitance Cx, the stray capacitance Cs2 is not charged. Also, since the stray capacitance Cs3 is regarded as a coupling capacitance of both the shielding lines s, the stray capacitance Cs3 can be eliminated by grounding the shielding lines s. In this way, the influence exerted by the stray capacitances of the cables for connecting the unknown capacitance Cx is reduced by using the shielding lines s, so that a charge equal to that induced on the unknown static capacitance Cx is induced on the capacitor Cf of the feedback circuit, resulting in an output proportional to the unknown static capacitance Cx produced from the operational amplifier OP. Stated another way, assuming that an output voltage of the AC signal generator OS is Vi, an output voltage Vo of the operational amplifier OP is expressed by −(Cx/Cf)Vi, so that the converter of FIG. 1 may be used to convert the unknown static capacitance Cx into the voltage Vo from which the unknown static capacitance Cx can be derived together with the known values Cf and Vi.

SUMMARY OF THE INVENTION

The static capacitance-to-voltage converter illustrated in FIG. 1, however, implies a problem that as the unknown static capacitance Cx is smaller, the influence of stray capacitances becomes prominent, so that the static capacitance Cx cannot be accurately converted into a voltage. In addition, since the feedback circuit of the operational amplifier OP is formed of a parallel circuit including the resistor Rf and the capacitor Cf, separate steps are required to form a resistor and a capacitor for actually integrating necessary components into a converter in a one-chip form, causing disadvantages of a complicated manufacturing process and an increased chip size. Furthermore, since the capacitor cannot be applied with an AC signal when one electrode of the static capacitance Cx is being biased at a certain voltage, a conversion of the static capacitance into an output voltage cannot be performed.

To solve the problem as mentioned, the applicant has proposed a static capacitance-to-voltage converter constructed as illustrated in FIG. 2. In the following, this static capacitance-to-voltage converter will be described in detail with reference to FIG. 2. An operational amplifier 21 has a voltage gain extremely larger than a closed loop gain. A gain seems to be almost infinity. A feedback resistor 23 is connected between an output terminal 22 and an inverting input terminal (−) of the operational amplifier 21 to form a negative feedback for the operational amplifier 21. The operational amplifier 21 has a non-inverting input terminal (+) connected to an alternating current (AC) signal generator 24 and the inverting input terminal (−) connected to one end of a signal line 25 which has the other end connected to one electrode $26_1$ of a capacitor 26 having an unknown or known static capacitance. The other electrode $26_2$ of the capacitance 26 is grounded, clamped to a fixed direct current (DC) bias voltage or not grounded. The other electrode $26_2$ may be applied with an AC bias. In this case, the bias current may have a frequency identical to or different from the frequency of an AC signal output from the AC signal generator 24.

The signal line 25 is surrounded by a shielding line 27 for preventing unwanted signals such as noise from being induced into the signal line 25 from the outside. The shielding line 27 is not grounded but is connected to the non-inverting input terminal (+) of the operational amplifier 21.

Since the operational amplifier 21 is formed with a negative feedback through the feedback resistor 23, and the operational amplifier 21 has a voltage gain extremely larger than a closed loop gain, the operational amplifier 21 is in an imaginary short-circuit state, and a gain seems to be almost infinity. In other words, an electric potential difference between the inverting input terminal (−) and the non-inverting input terminal (+) of the operational amplifier 21 is substantially zero. Thus, since the signal line 25 and the shielding line 27 are at the same voltage, it is possible to cancel a stray capacitance possibly occurring between the signal line 25 and the shielding line 27. This holds true irrespective of the length of the signal line 25, and also holds true irrespective of movements, bending, folding and so on of the signal line 25.

Assume now that an AC output voltage of the AC signal generator 24 is Vi; its angular frequency is ω; the static capacitance of the capacitor 26 is Cx; a current flowing through the capacitance 26 is $i_1$; the resistance of the feedback resistor 23 is Rf; a current flowing through the feedback resistor 23 is $i_2$; a voltage at the inverting input terminal of the operational amplifier 21 is Vm; an output voltage of the operational amplifier 21 is V, the voltage Vm at the inverting input terminal (−) is at the same voltage as the AC signal output voltage Vi of the AC signal generator 24 since the operational amplifier 21 is in an imaginary short-circuit state, as mentioned above. That is, the following equation is satisfied:

$$Vi=Vm$$

In addition, the following equations are also satisfied:

$$i_1 = -Vm/(1/j\omega Cx) = -Vi/(1/j\omega Cx)$$

$$i_2 = (Vm-V)/Rf = (Vi-V)/Rf$$

Here, since $i_1 = i_2$, the output voltage V of the operational amplifier 21 is expressed by the following equation:

$$V = Vi(1 + j\omega Rf \cdot Cx)$$

This equation indicates that the output voltage V of the operational amplifier 21 includes an AC component proportional to the static capacitance Cx. It is therefore possible to derive a DC voltage proportional to the static capacitance Cx by appropriately processing the output voltage V.

As described above, since the operational amplifier 21 is in an imaginary short-circuit state so that a stray capacitance occurring between the signal line 25 and the shielding line 27 will not appear between the inverting input terminal (−) and the non-inverting input terminal (+) of the operational amplifier 21, the equation representing the output voltage V of the operational amplifier 21 does not include a term related to the stray capacitance occurring between the signal line 25 and the shielding line 27. For this reason, a very small static capacitance Cx can be converted into a voltage. In addition, even if the AC output voltage Vi has a low angular frequency ω, a voltage V exactly corresponding to the static capacitance Cx can be output.

In the static capacitance-to-voltage converter of FIG. 2, since the signal line 25 and one end of the feedback resistor 23 are connected to the inverting input terminal (−) of the operational amplifier 21, the signal line 25 inevitably includes a portion left exposed, without being surrounded by the shielding line 27, near the end connected to the inverting input terminal. Since a stray capacitance is formed between the exposed portion of the signal line 25 and its surroundings, the influence of this stray capacitance becomes sometimes more prominent as the static capacitance Cx is smaller, causing a problem that an accurate detection of the static capacitance Cx is prevented.

The present invention has been proposed to solve the problems mentioned above, and it is therefore an object of the present invention to provide an impedance-to-voltage converter and an associated converting method which are capable of highly accurate conversion of an impedance of an object under measurement into a corresponding voltage by utilizing an operational amplifier in an imaginary short-circuit state to eliminate the influence of a stray capacitance between a line connected to a non-inverting terminal of the operational amplifier and a shielding line surrounding the line, and eliminating the influence of a stray capacitance formed by an unshielded portion of the signal line.

To achieve the above object, the present invention provides a static capacitance-to-voltage converter comprising:

an operational amplifier having an inverting input terminal, a non-inverting input terminal and an output terminal, wherein the operational amplifier has the output terminal and the inverting input terminal connected through a feedback resistor, and operable in an imaginary short-circuit state between the inverting input terminal and the non-inverting input terminal;

a signal line having one end connected to the inverting input terminal and the other end capable of being connected to a static capacitance element having a static capacitance;

a shield surrounding at least a portion of the signal line, and connected to the non-inverting input terminal;

alternating current signal generator for applying the non-inverting input terminal with an alternate current signal; and an adjuster connected to the output terminal of the operational amplifier and an output terminal of the alternating current signal generator for adjusting an output of the static capacitance-to-voltage converter to minimum (almost equal to zero) when no static capacitance element is connected to the signal line.

The adjuster comprises a variable frequency generator of the alternate current signal and an adjuster for adjusting amplitudes and phases of an output signal of the operational amplifier and the alternate current signal such that they are canceled with each other.

The adjuster preferably comprises:

first adjuster for adjusting the amplitude of the alternate current signal;

second adjuster for adjusting the phase and amplitude of an output voltage from the operational amplifier such the output voltage has the same amplitude as and an opposite phase to an output of the first adjuster; and an adder for adding the output of the first adjuster and an output of the second adjuster.

Alternatively, the adjuster preferably comprises:

third adjuster for adjusting the amplitude of the output voltage of the operational amplifier;

fourth adjuster for adjusting the phase and amplitude of the alternate current signal such that the alternating current signal has the same amplitude as and an opposite phase to an output of the third adjuster; and an adder for adding the output of the third adjuster and an output of the fourth adjuster.

Further, an integrator may be additionally provided for integrating an output of the adjuster, so that when a static capacitance is connected to the other end of the signal line, a signal corresponding to the static capacitance of the static capacitance can be produced as an output of the integrator. Furthermore, a comparator may be provided for comparing the phase of the output of the integrator with the phase of the alternate current signal. In this case, when a static capacitance is connected to the other end of the signal line, a signal representative of dielectric loss tangent for the static capacitance of the static capacitance can be produced as an output of the comparator.

First and second synchronous detectors may further be provided for receiving the output of the integrator and the alternate current signal, such that the first synchronous detector outputs a signal representative of the static capacitance of the static capacitance, and the second synchronous detector outputs a signal representative of dielectric loss tangent for the static capacitance of the static capacitance.

The present invention also provides a method of converting a static capacitance into a voltage comprising:

creating an imaginary short-circuit state between an inverting input terminal and a non-inverting input terminal of an operational amplifier;

connecting one end of a signal line to the inverting input terminal, where the signal line has at least a portion thereof surrounded by a shield;

placing the shield at the same voltage as the non-inverting input terminal;

applying an alternate current signal to the non-inverting input terminal;

adjusting an output signal of the operational amplifier and the alternating current signal such that the output signal and the alternate current signal are canceled with each other when no static capacitance is connected to the other en of the signal line; and connecting a static capacitance to the other end of the signal line, after the adjusting an output signal of the operational amplifier and the alternating current signal such that the output signal and the alternating current signal arc canceled with each other when no static capacitance is connected to the other end of the signal line, to retrieve a voltage signal corresponding to the static capacitance of the static capacitance.

Preferably, the adjusting an output signal of the operational amplifier and the alternating current signal such that the output signal and the alternating current signal are canceled with each other when no static capacitance is connected to the other end of the signal line comprises:

varying the frequency of the alternating current signal; and adjusting the output signal of the operational amplifier and the alternating current signal in phase and amplitude such that the output signal and the alternating current signal are canceled with each other.

Also, the adjusting an output signal of the operational amplifier and the alternating current signal such that the output signal and the alternating current signal are canceled with each other when no static capacitance is connected to the other end of the signal line may comprise:

adjusting the amplitude of the alternating current signal;

adjusting the phase and amplitude of an output voltage from the operational amplifier such that the output voltage has the same amplitude and an opposite phase to the alternating current signal having its amplitude adjusted; and adjusting the amplitude of the output voltage of the operational amplifier;

adjusting the phase and amplitude of the alternate current signal such that the alternating current signal has the same amplitude and an opposite phase to the output voltage of the operational amplifier having its amplitude adjusted; and The shield is preferably a shielding line surrounding the signal line over its entire length. Also, the static capacitance may be a capacitive sensor. In addition, the static capacitance may comprise a measuring electrode so that a static capacitance is formed between an object under measurement and the measuring electrode.

Furthermore, during measurement waiting time, the measuring electrode may be accommodated in a case which is placed at the same voltage as a non-inverting input terminal of the operational amplifier, and a zero adjustment is performed to cancel a stray capacitance formed between the measuring electrode and its surroundings.

Since the operational amplifier is placed in an imaginary short-circuit state between the inverting input terminal and the non-inverting input terminal, a stray capacitance formed between the signal line and the shielding line is canceled. Also, by adjusting the static capacitance-to-voltage converter so that its output is minimum (almost equal to zero) when no static capacitance is connected to the signal line, the static capacitance-to-voltage converter is free from the influence of a stray capacitance formed by an exposed portion of the signal line. Thus, a voltage corresponding to a static capacitance is output without suffering from such stray capacitances, however long the signal line and the shield are.

BEST MODE FOR CARRYING OUT THE INVENTION

Figure 1:
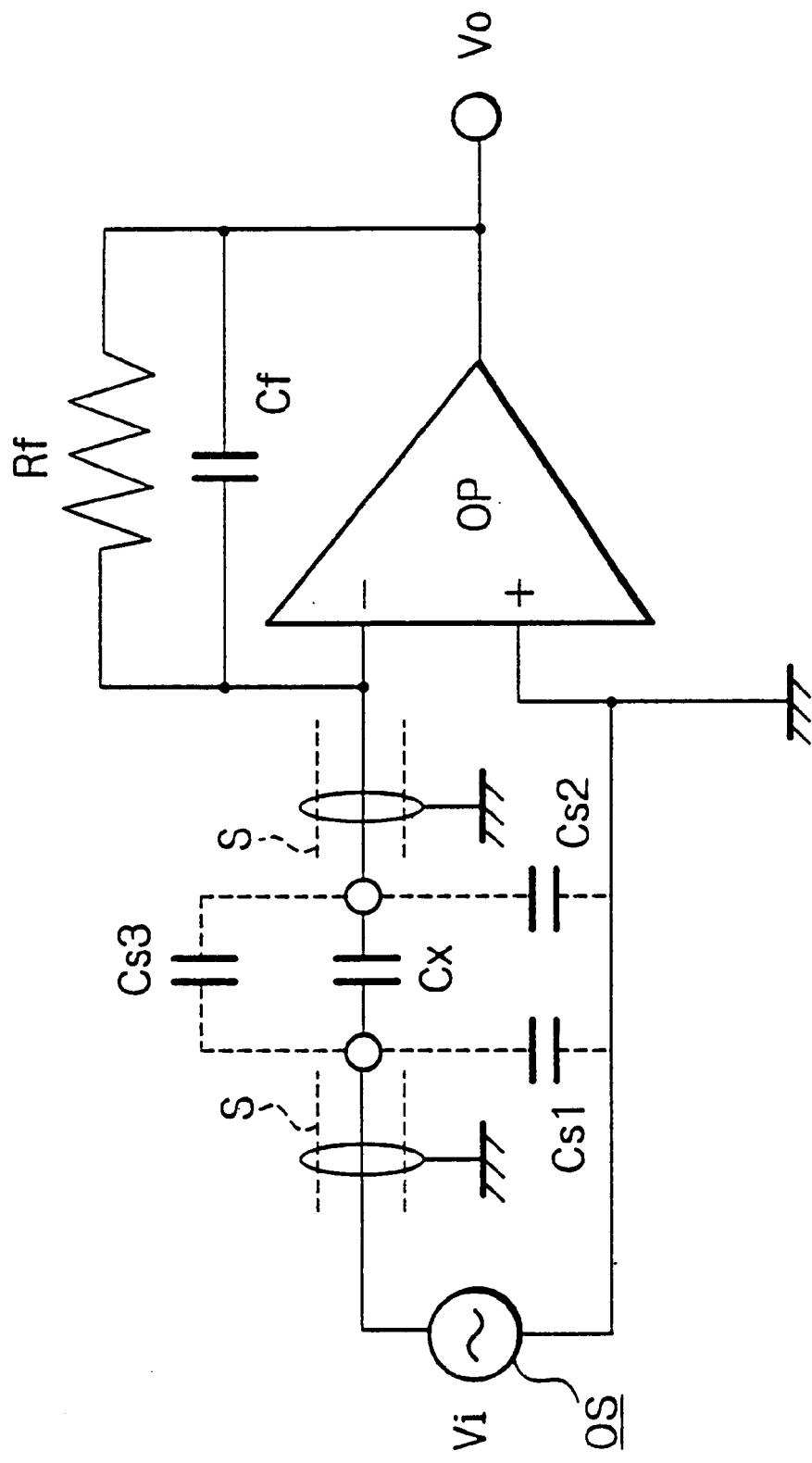
FIG. 1 is a schematic circuit diagram illustrating an example of a prior art static capacitance-to-voltage converter.
Figure 2:
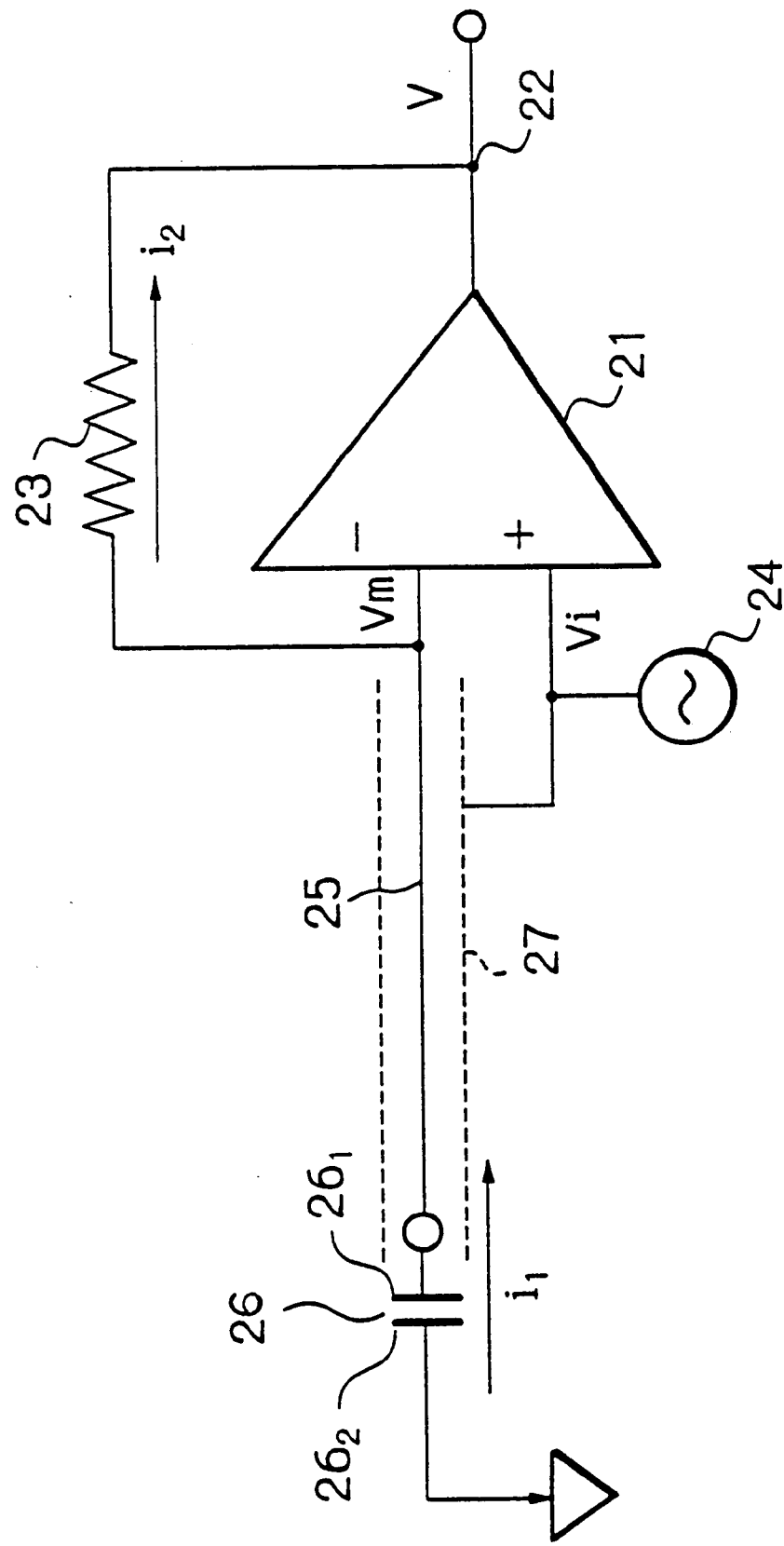
FIG. 2 is a schematic circuit diagram illustrating a static capacitance-to-voltage converter proposed by the applicant for solving drawbacks of the static capacitance-to-voltage converter of FIG. 1.
Figure 3:
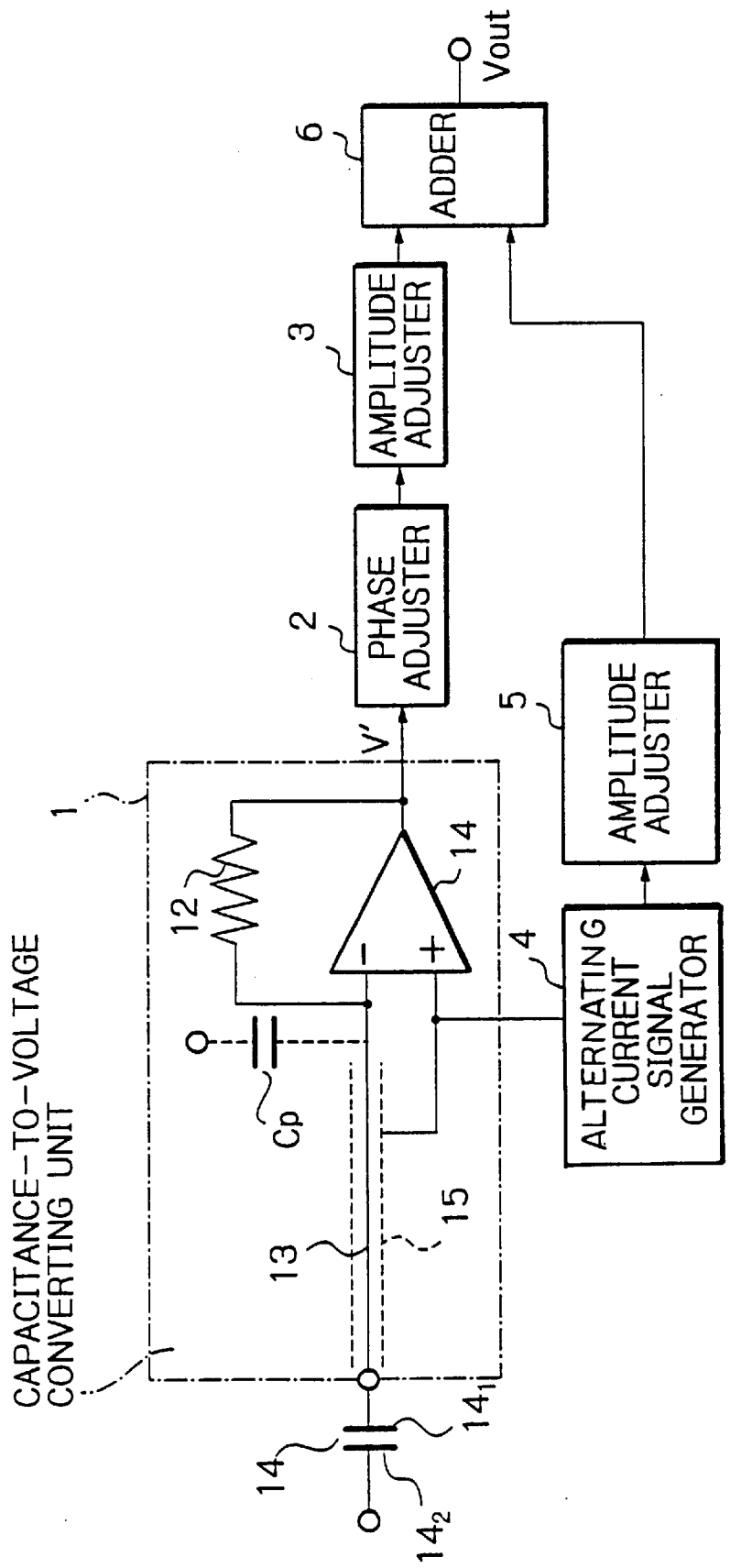
FIG. 3 is a block diagram generally illustrating the configuration of a first embodiment of a static capacitance-to-voltage converter according to the present invention.

The present invention will hereinafter be described in detail in connection with preferred embodiments thereof with reference to the accompanying drawings. FIG. 3 is a block diagram generally illustrating a first embodiment of a static capacitance-to-voltage converter according to the present invention. Referring specifically to FIG. 3, the static capacitance-to-voltage converter comprises a capacitance-to-voltage converting unit 1; a phase adjuster 2 for adjusting the phase of an output voltage of the capacitance-to-voltage converting unit 1; a first amplitude adjuster 3 for adjusting the amplitude of a phase adjusted voltage; an alternating current (AC) signal generator 4 having a variable frequency generator 25; a second amplitude adjuster 5 for adjusting the amplitude of an AC signal from the AC signal generator 4; and an adder 6 for adding voltages output from the first amplitude adjuster 3 and the second amplitude adjuster 4.

The capacitance-to-voltage converting unit 1 includes an operational amplifier 11 which may be an amplifier having a voltage gain extremely larger than a closed loop gain. A gain seems to be almost infinity. A feedback resistor 12 is connected between an output and an inverting input terminal (−) of the operational amplifier 11 to form a negative feedback for the operational amplifier 11. The operational amplifier 11 has a non-inverting input terminal (+) applied with an AC signal from the AC signal generator 4, and the inverting input terminal (−) connected to one end of a signal line 13. The other end of the signal line 13 may be connected to a static capacitance element 14 having a static capacitance Cx such as a capacitor or the like. The static capacitance element 14 includes one electrode $14_1$ and the other electrode $14_2$ which is grounded, clamped to a fixed DC bias voltage, or not grounded. Alternatively, the other electrode $14_2$ may be applied with an AC bias having a frequency identical to or different from the frequency of the AC signal from the AC signal generator 4. While an ambient AC signal is further applied to the inverting input terminal (−) through a stray capacitance Cp, this AC signal generally has a frequency which is different from that of the AC signal from the AC signal generator 4 and that of the AC bias applied to the electrode $14_2$.

The signal line 13 is surrounded by a shielding line 15 for preventing unwanted signals such as noise from being induced into the signal line 13 from the outside. The shielding line 15 is not grounded but is connected to the non-inverting input terminal (+) of the operational amplifier 11.

Figure 7:
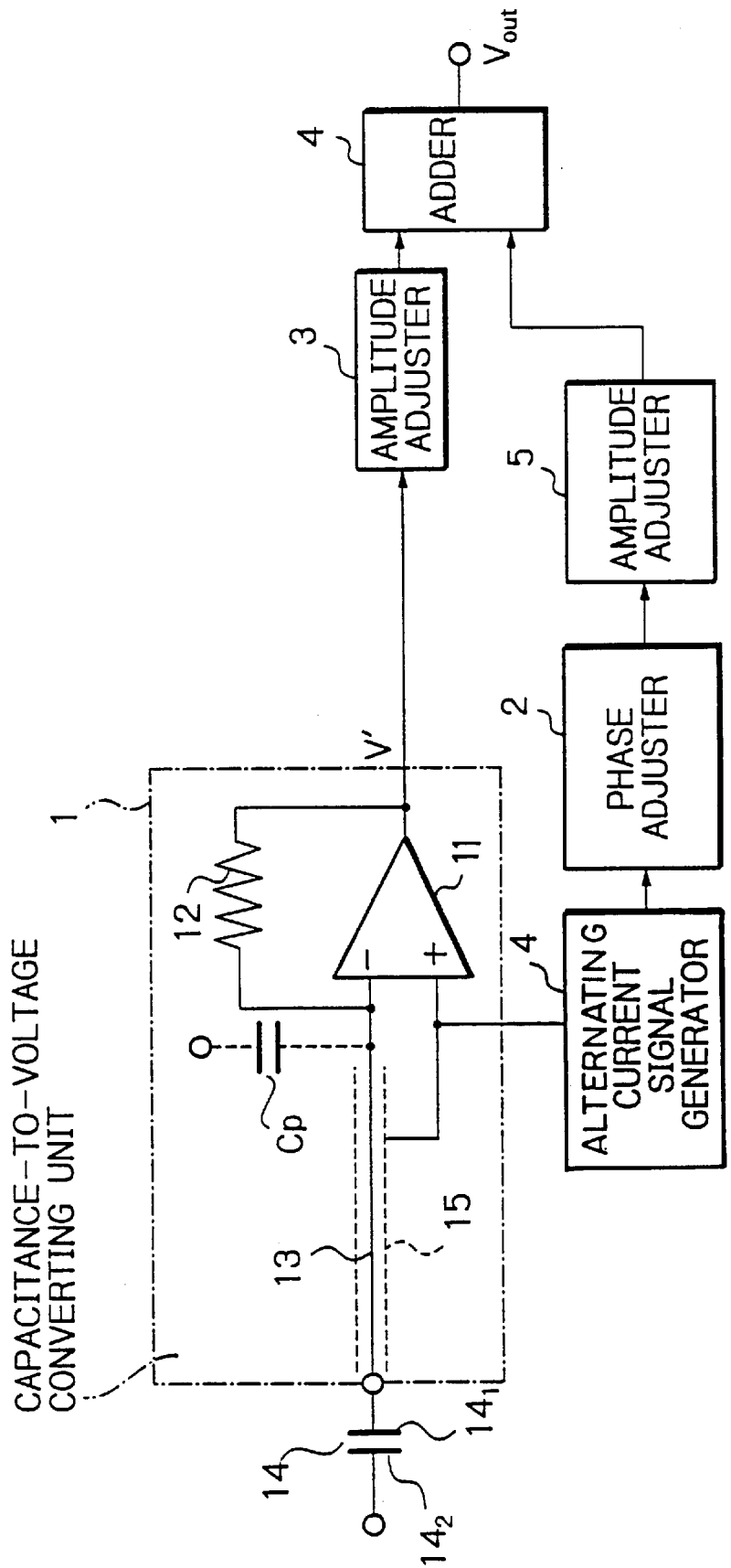
FIG. 7 is a block diagram generally illustrating the configuration of a second embodiment of the static capacitance-to-voltage converter according to the present invention.

The capacitance-to-voltage converting unit 1 has substantially the same configuration as a static capacitance-to-voltage converter illustrated in FIG. 7. Specifically, since the operational amplifier 11 is formed with a negative feedback through the feedback resistor 12, the operational amplifier 11 has a voltage gain extremely larger than a closed loop gain, and a gain seem to be almost infinity, the operational amplifier 11 is in an imaginary short-circuit state between both the input terminals thereof. In other words, a difference in voltage between the inverting input terminal (−) and the non-inverting input terminal (+) of the operational amplifier 11 is substantially zero. Thus, since the signal line 13 and the shielding line 15 are at the same electric potential (so-called voltage), it is possible to cancel a stray capacitance possibly occurring between the signal line 13 and the shielding line 15. This holds true irrespective of the length of the signal line 13, and also holds true irrespective of movements, bending, folding and so on of the signal line 13.

However, since the signal line 13 has a portion near the end connected to the inverting input terminal (−) of the operational amplifier 11 left exposed, without being shielded by the shielding line 15, a stray capacitance Cp is formed between the exposed portion of the signal line 13 and its surroundings. This stray capacitance Cp adversely affects the output voltage of the operational amplifier 11 and hence an output voltage V' of the capacitance-to-voltage converting unit 1, with the result that the output voltage V' fails to accurately represent the static capacitance of the static capacitance element 14.

To eliminate the influence of the stray capacitance Cp, in the first embodiment of the present invention, the frequency of the AC signal output from the AC signal generator 4 is adjusted to reduce the output voltage Vout of the adder 6 to substantially zero when the static capacitance element 14 is not connected to the other end of the signal line 13, as well as the phase and amplitude of the output voltage V' is adjusted by the phase adjuster 2 and the first amplitude adjuster 3, respectively, and the amplitude of the AC signal from the AC signal generator 4 is adjusted by the second amplitude adjuster 5 such that the output of the first amplitude adjuster 3 has the same amplitude as and the opposite phase to the output of the second amplitude adjuster 5. Then, the two outputs are added by the adder 6. In this way, the outputs of the first amplitude adjuster 3 and the second amplitude adjuster 5 are canceled.

Stated another way, the variable frequency generator 25 of the AC signal generator 4, the phase adjuster 2, the first amplitude adjuster 3, the second amplitude adjuster 5, and the adder constitute an adjuster which minimizes electric potential difference or which adjusts electric potential difference. When the static capacitance element 14 is connected to the other end of the signal line 13 after minimizing or a zero adjustment has been made, a voltage Vout exactly corresponding to the static capacitance of the static capacitance element 14 is output from the adder 6 without suffering from the influence of the stray capacitance Cp and a stray capacitance between the signal line 13 and the shielding line 15.

Figure 4:
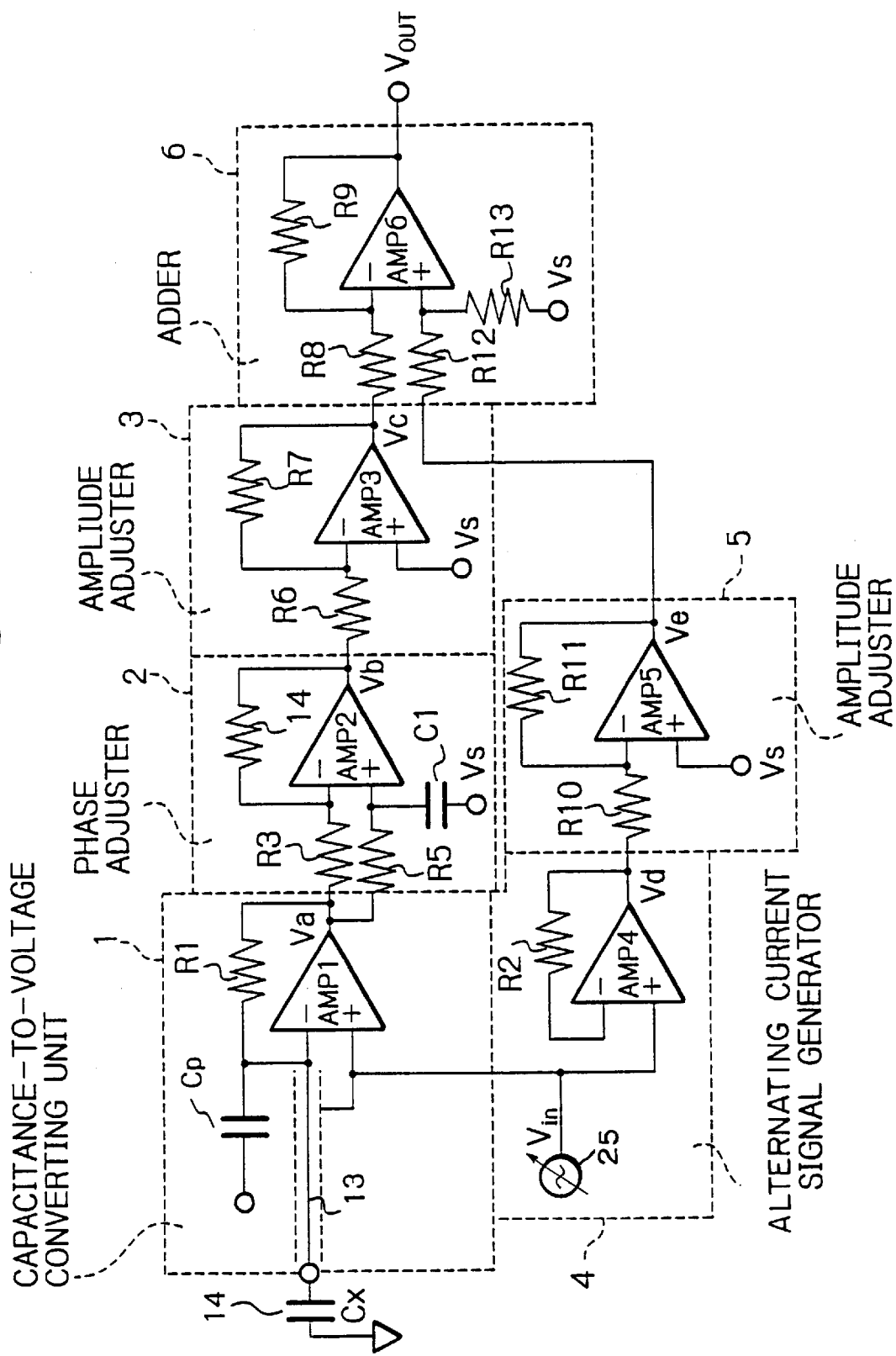
FIG. 4 is a circuit diagram illustrating an example of a specific configuration of the static capacitance-to-voltage converter of FIG. 3.

FIG. 4 is a circuit diagram illustrating an example of the configuration and interconnections between various components of the static capacitance-to-voltage converter of FIG. 3. FIG. 4 shows resistors R1–R13; a capacitor C1; operational amplifiers AMP1–AMP6; an AC signal Vin having an angular frequency ω; and a bias voltage Vs which is applied to non-inverting input terminals of respective operational amplifiers in the phase adjuster 2, the first amplitude adjuster 3, the second amplitude adjuster 5 and the adder 6. It should be noted that the capacitance-to-voltage converting unit 1 in FIG. 4 is composed of the resistor R1 representative of the feedback resistor 12 and the operational amplifier AMP1 representative of the operational amplifier 11. The AC signal generator 4 in turn is configured to apply the output Vin of an oscillator to a buffer including the operational amplifier AMP4 to produce an output voltage Vd (=Vin).

In the following, the operation of the static capacitance-to-voltage converter in FIG. 4 will be described from a mathematical viewpoint. Assume now that the output voltage of the capacitance-to-voltage converting unit 1 is Va; the output voltage of the phase adjuster 2 is Vb; the output voltage of the first amplitude adjuster 3 is Vc; the output voltage of the AC signal generator 4 is Vd; the output voltage of the second amplitude adjuster 5 is Ve; and R3=R4. Further, assuming Vs=0 for simplifying the calculation, the following equation is satisfied:

$$Va=Vin[1+R1 \cdot j\omega(Cx+Cp)]$$

$$Vb=Va(1-R5 \cdot j\omega C1)/(1+r5 \cdot j\omega C1)$$

$$Vc=(R7/R6)Vb$$

$$Vd=Vin$$

$$Ve=(R11/R10)Vin$$

$$Vout=-(R9/R8)Vc+[1+(R9/R8)]\times[R13/(R12+R13)]Ve$$

Therefore, the output voltage Vout of the adder 6 is expressed by the following equation:

$$Vout=(R9/R8)(R7/R6)\times\{[1+R1\cdot j\omega)(Cx+Cp)](1-R5\cdot j\omega C1)/(1+R5j\omega C1)\}Vin-\{1+(R9/R8)[R13/(R12+R13)]\}\times(R11/R10)Vin$$

Here, when the resistances are selected such that R1=R2, R6=R7, R8=R9, R10=2R11, R12=R13 are satisfied, the output voltage Vout of the adder 6 can be rewritten as follows:

$$Vout=\{[1+R1\cdot j\omega(Cx+Cp)](1-R5\cdot j\omega C1)/(1+R5\cdot j\omega C1)\}Vin-2Vin \quad (1)$$

In the present invention, first, when the static capacitance element 14 is not connected to the signal line 13, i.e., when Cx=0, the phase and amplitude of the output voltage of the capacitance-to-voltage converting unit 1 and the angular frequency and amplitude of the AC signal output from the AC signal generator 4 are adjusted such that Vout in the equation (1) is zero. Substituting Vout=0 in the equation (1) for finding a condition in which Vout is zero, the following equation is derived:

$$\{[1+R1·j\omega(Cp)](1-R5·j\omega C1)/(1+R5·j\omega C1\}-2=0$$

This equation is rewritten in the following form:

$$R1R5\omega^2 C1Cp-1+(R1Cp-3R5C1)j\omega=0$$

To satisfy this equation, the following conditions must be met:

$$R1R5\omega^2 C1Cp=1 \quad (2)$$

$$R1Cp=3R5C1 \quad (3)$$

Thus, substituting the equation (3) into the equation (2), and solving the equation (2) for $\omega$, $$\omega=1/(R1CpR5C1)^{1/2}=1/[(3)^{1/2}R5C1] \quad (4)$$

is derived.

As will be understood from the foregoing, in the present invention, R5, C1 and $\omega$ are adjusted so as to satisfy the equations (3) and (4) in a state in which the static capacitance element 14 is not connected to the signal 13, so that the output voltage Vout of the adder 6 becomes zero.

Next, when the static capacitance element 14 is connected to the signal line 13, the following equation is satisfied as mentioned above:

$$\{[1+R1·j\omega(Cp)](1-R5·j\omega C1)/(1+R5·j\omega C1\}Vin-2Vin=0$$

Further, since the equations (3) and (4) are satisfied, the equation (1) can be rewritten as follows:

$$Vout=R1·j\omega Cx(1-R5·j\omega C1)/(1+R5·jC1)$$

Substituting this into the equation (4), Vout is expressed as follows:

$$Vout=(4/3)VinR1·j\omega Cx \quad (5)$$

This equation (5) indicates that the output voltage Vout of the adder 6 is not influenced at all by any static capacitance other than the static capacitance Cx of the static capacitance element 14.

As described above in detail, since the static capacitance-to-voltage converter illustrated in FIGS. 3 and 4 cancels a stray capacitance formed between the signal line 13 and the shielding line 15, and a stray capacitance formed between the exposed portion o f the signal line 13 and its surroundings, it can output a voltage exactly corresponding to the static capacitance Cx of the static capacitance element 14 without suffering from the influence of such stray capacitances.

In the description heretofore made, connecting the static capacitance element 14 having the static capacitance Cx to the signal line 13 is equivalent to a change in the static capacitance connected to the inverting input terminal of the operational amplifier AMP1 by Cx. Therefore, the static capacitance-to-voltage converter of FIGS. 3 and 4 can also output a voltage exactly corresponding to $\Delta Cx$ when the static capacitance Cx of the static capacitance element 14 connected to the signal line 13 has changed by $\Delta Cx$. In the following, this operation will be described in detail in connection with the static capacitance-to-voltage converter of FIG. 4.

The output voltage Vout of the adder 6 when the static capacitance element 14 is connected to the signal line 13 is expressed by the aforementioned equation (1). Assume that Vout is zero in this condition. Conditions for satisfying this can be found by giving Vout=0 in the equation (1):

$$R5C1=(1/3)R1(Cx+Cp) \quad (6)$$

$$\omega=1/(3)^{1/2}R5C1 \quad (7)$$

Stated another way, the output voltage Vout of the adder 6 can be made zero by adjusting the angular frequency $\omega$ of the AC signal from the AC signal generator 4, R5 and C1 to satisfy the equations (6) and (7).

Next, the output voltage Vout of the adder 6, when the static capacitance Cx of the static capacitance element 14 has changed by $\Delta Cx$, can be expressed by substituting Cx+$\Delta$Cx for Cx in the equation (1):

$$Vout=\{[1+R1·j\omega(Cx+\Delta Cx+Cp)]\times(1-R5·j\omega C1)/(1+R5·j\omega C1)\}Vin-2Vin \quad (8)$$

Then, substituting the equations (6) and (7) into the equation (8), and using V=0 in the equation (1):

$$Vout=(4/3)VinR1·j\omega\Delta Cx \quad (9)$$

This equation indicates that Vout exactly corresponds to $\Delta Cx$. This also indicates that the static capacitance-to-voltage converter of FIG. 4 is capable of outputting a voltage exactly corresponding to a change in capacitance of the static capacitance element 14 connected to the signal line 13.

While the foregoing description has been made on the assumption that Vs=0 is satisfied, the same conclusion is derived also when Vs≠0, only except that associated calculations are more complicated. Alternatively, in FIGS. 3 and 4, a subtractor may be used in place of the adder 6 such that the subtractor is applied with the output of the first amplitude adjuster 3 and the output of the second amplitude adjuster 5 which are adjust ed to have the same amplitude and the same phase.

Next, a capacitance meter, which is an exemplary application of the static capacitance-to-voltage converter illustrated in FIG. 3, will be described with reference to FIG. 5. This capacitance meter is configured such that an integrator 16 is connected additionally to the adder in FIG. 3, and outputs of the integrator 16 and the AC signal generator 4 are connected to a phase comparator 17.

As mentioned above, the output voltage Vout of the adder 6 is expressed by the equations (5) and (9). By integrating this voltage by the integrator 16, it is possible to produce a voltage E which is proportional to the static capacitance Cx of the static capacitance element 14 or a change $\Delta Cx$ in the static capacitance Cx. Also, by using the phase comparator 17 to derive a difference in phase between the voltage E output from the integrator 16 and the AC signal Vin output from the AC signal generator 4, dielectric loss tangent can be derived for the static capacitance element 14.

Figure 5:
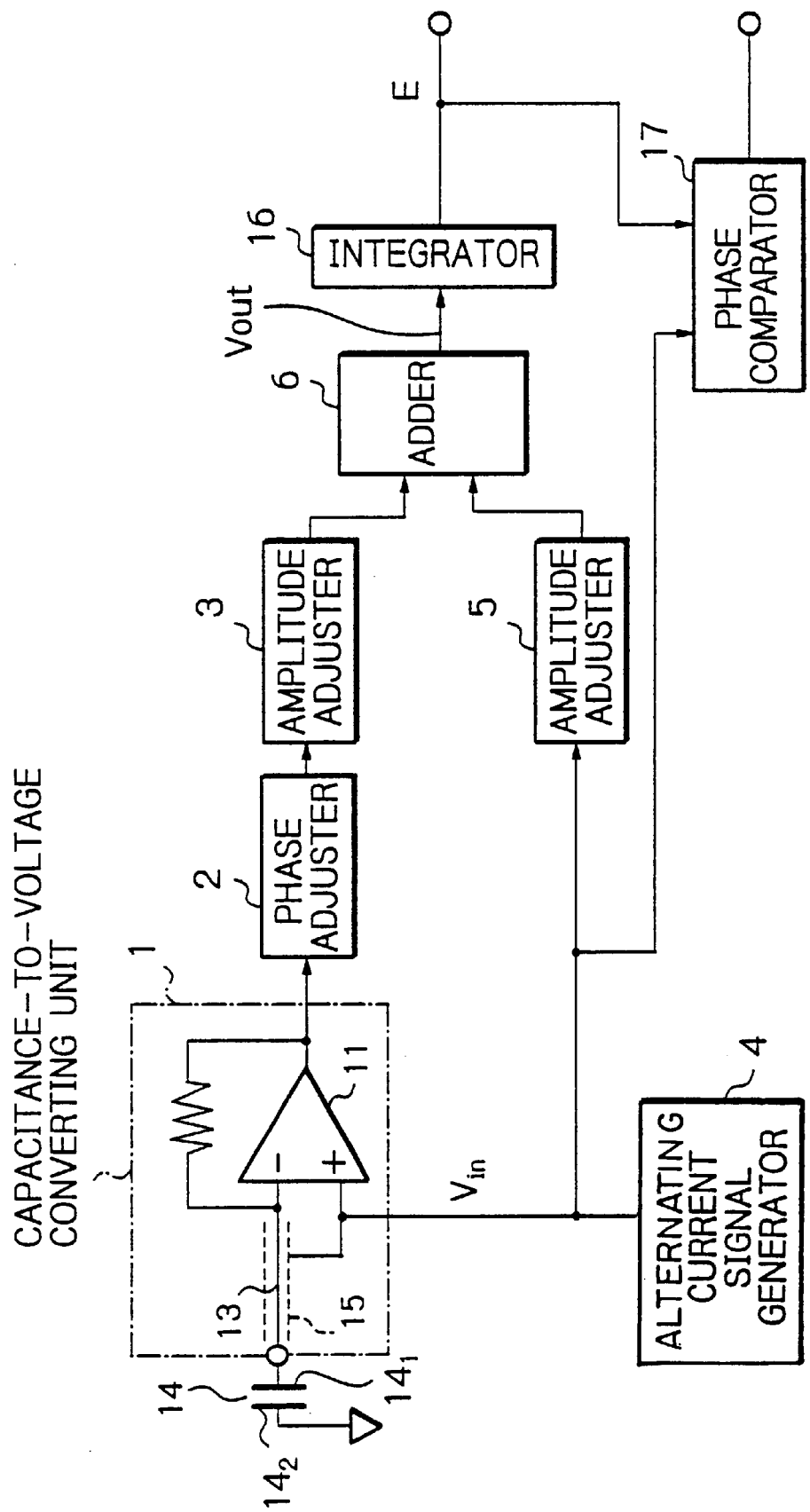
FIG. 5 is a block diagram illustrating the configuration of a capacitance meter which applies the static capacitance-to-voltage converter shown in FIG. 3.

In a manner similar to the foregoing, the capacitance meter illustrated in FIG. 5 may also be designed such that one electrode $14_1$ of the static capacitance element 14 is used as a measuring electrode, and the other electrode $14_2$ is used as an object under measurement for which a determination is made as to whether it is good or bad based on the magnitude of a static capacitance Cx formed between the one electrode $14_1$ and the other electrode $14_2$. In this case, a housing for the capacitance meter is provided with a case having the same electric potential (so-called voltage) as the operational amplifier 11. After the measuring electrode is accommodated in this case, the output voltage Vout of the adder 6 is adjusted to a minimum or zero. In this event, if the measuring electrode is taken out of the case during a measurement, the adder 6 experiences a drift by a voltage proportional to a stray capacitance between the measuring electrode and its surroundings. Therefore, a static capacitance between the measuring electrode and the object under measurement can be more accurately measured by correcting the phase adjuster 2, the first amplitude adjuster 3 and the second amplitude adjuster 5 such that the drift value becomes minimum or zero. When a measurement was actually made using a semiconductor device made of silicon, the capacitor meter was able to measure a very small static capacitance on the order of 1 femtofarad to 2 femtofarad, thereby demonstrating that the present invention is significantly effective.

Figure 6:
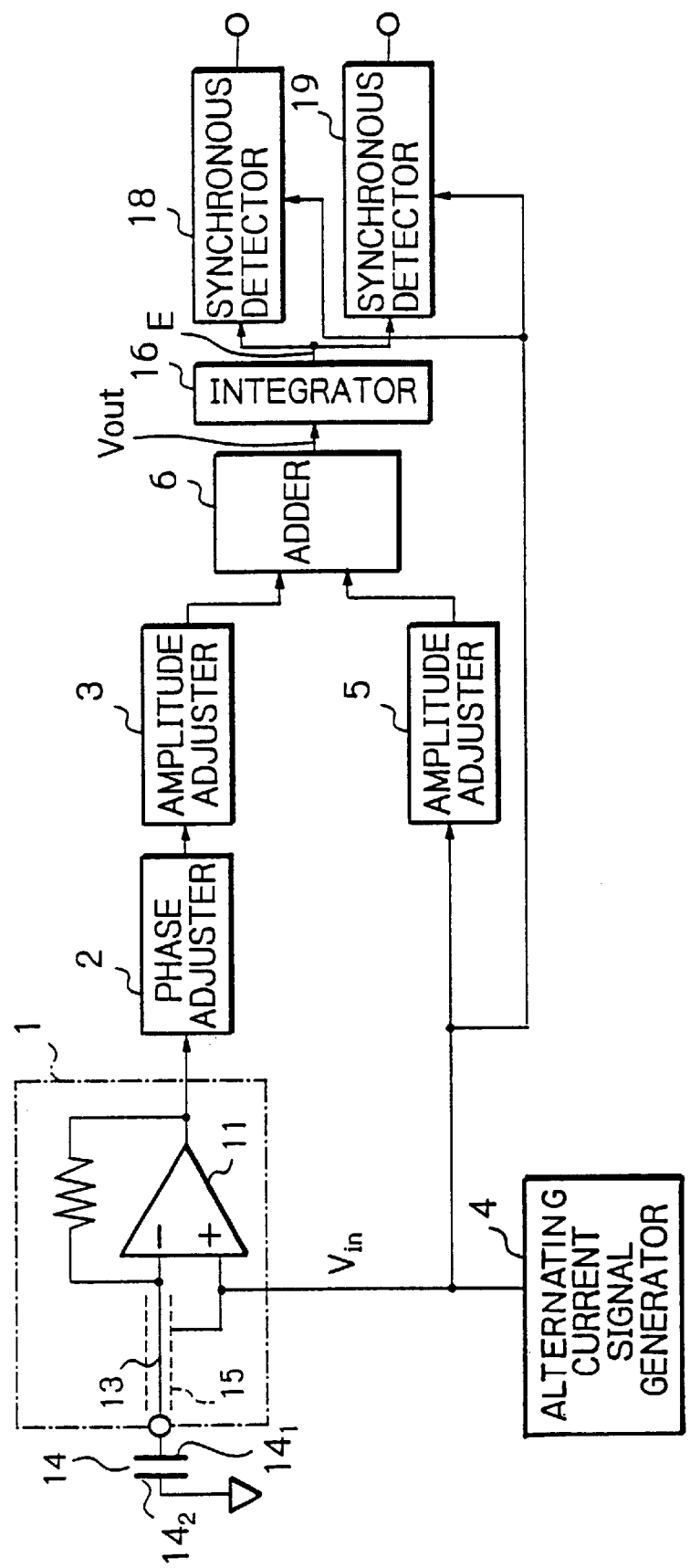
FIG. 6 is a block diagram illustrating an example of a modification to the capacitance meter shown in FIG. 5.

FIG. 6 is a block diagram generally illustrating an exemplary modification to the capacitor meter illustrated in FIG. 5, where the output of the integrator 16 in FIG. 5 is connected to a first synchronous detector 18 and a second synchronous detector 19, such that these synchronous detectors 18, 19 are applied with an AC signal from an AC signal generator 4. When the first synchronous detector 18 synchronously detects a voltage E output from the integrator 16 with the AC signal Vin which is in phase with the voltage E, the static capacitance Cx of a static capacitance element 14 or a change ΔCx in the static capacitance Cx can be derived as an output of the first synchronous detector 18. Similarly, when the second synchronous detector 19 synchronously detects the voltage E from the integrator 16 with the AC signal Vin which is out of phase by 90° from the voltage E, dielectric loss tangent for the static capacitance element 14 can be derived as an output of the second synchronous detector 19.

More specifically, the static capacitance Cx of the static capacitance element 14 can be derived by the first synchronous detector 18 as an average value or an integrated value of the voltage E over a range from 0° to 180° with respect to the phase of the AC signal Vin from the AC signal generator 4. Also, the dielectric loss tangent for the static capacitance Cx of the static capacitance element 14 can be derived by the second synchronous detector 19 as an average value or an integrated value of the voltage E over a range from 90° to 270° with respect to the phase of the AC signal Vin from the AC signal generator 14.

Next, a second embodiment of the static capacitance-to-voltage converter according to the present invention will be described with respect to the configuration with reference to FIG. 7. The second embodiment illustrated in FIG. 7 differs from the first embodiment illustrated in FIG. 3 in that the phase adjuster 2 is not connected between the capacitance-to-voltage converting unit 1 and the first amplitude adjuster 3, but between the AC voltage generator 4 and the second amplitude adjuster 5. While in the layout illustrated in FIGS. 3 and 4, high harmonic components of the AC signal Vin output from the AC signal generator 4 may be introduced into the phase adjuster 2 or the first amplitude adjuster 3, such an inconvenience can be effectively prevented by connecting the phase adjuster 2 between the AC signal generator 4 and the second amplitude adjuster 5, as illustrated in FIG. 7.

Figure 8:
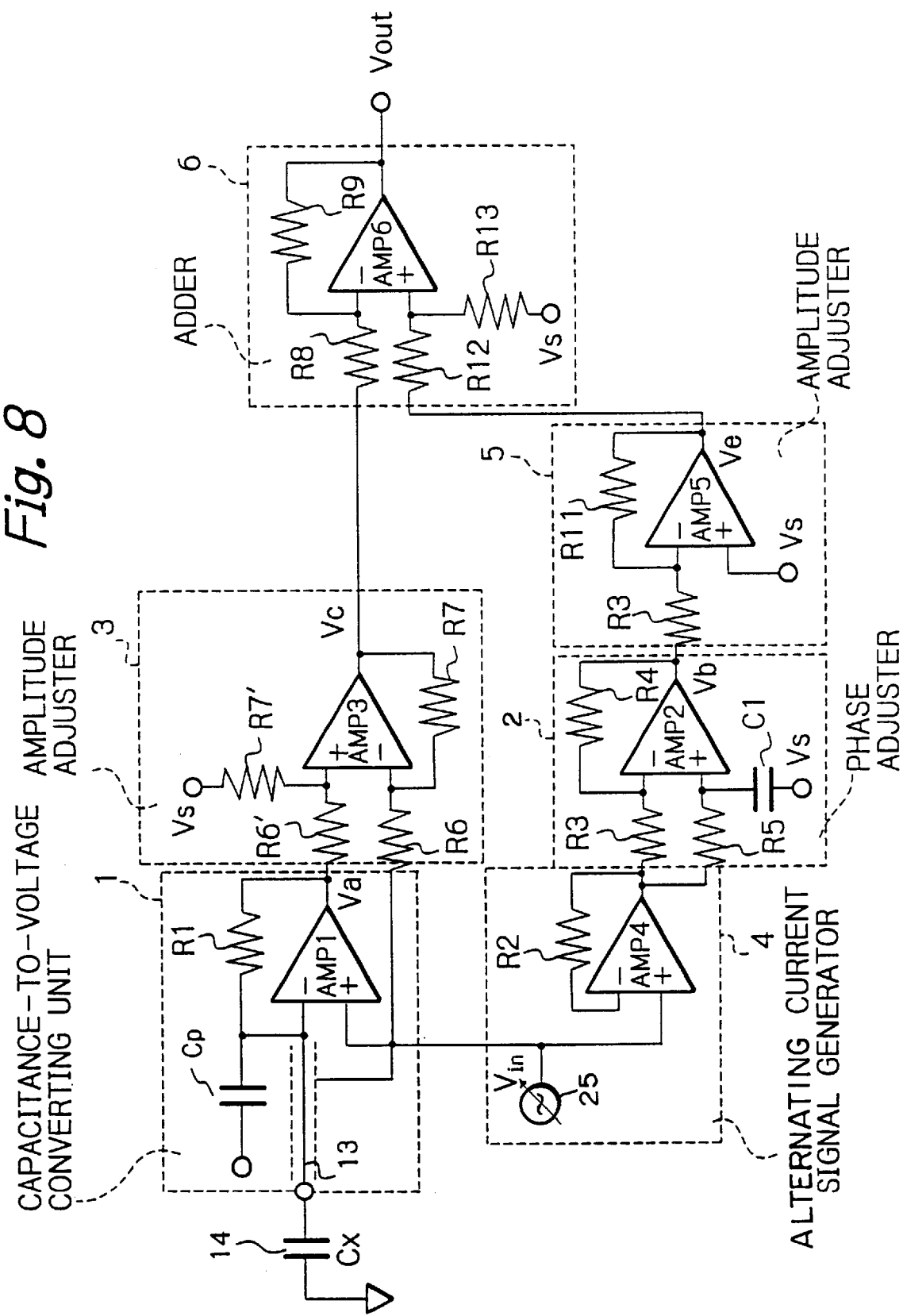
FIG. 8 is a circuit diagram illustrating an example of a specific configuration of the static capacitance-to-voltage converter of FIG. 7.

FIG. 8 is a circuit diagram illustrating an example of the configuration of each component in the static capacitance-to-voltage converter of FIG. 7 and interconnections between these components, wherein components identical or similar to those illustrated in FIG. 4 are designated the same reference numerals. Note, however, that the configuration of the first amplitude adjuster 3 is modified such that the output of the capacitance-to-voltage converting unit 1 is connected to the non-inverting input terminal of the operational amplifier AMP3 through a resistor R6', and an AC bias voltage Vs is applied to the inverting input terminal of the operational amplifier AMP3 through a resistor R7'.

In the following, the operation of the static capacitance-to-voltage converter of FIG. 8 will be described from a mathematical viewpoint. In FIG. 8, the following equations are satisfied:

$$Va=Vin[1+R1 \cdot j\omega(Cx+Cp)]$$

$$Vb=Vin$$

$$Vc=(R7/R6)Vin+[1+(R7/R6)]\times[R7'/(R6'+R7')]Va$$

$$Vd=[(1+R4/R3)/(1+R5 \cdot j\omega C1)-R4/R3]Vb$$

$$Ve=(R11/R10)Vd$$

$$Vout=-(R9/R8)Vc+[1+(R9/R8)]\times[R13/(R12+R13)]Ve]$$

Therefore, the output voltage Vout of the adder 6 is expressed by the following equation:

$$Vout=(R9/R8)(R7/R6)Vin-\{[1+R7/R6]\times[R7'/(R6'+R7')][1+R1 \cdot j\omega(Cx+Cp)]\}Vin-\{[1+(R9/R8)]\times[R15/(R12/R3)](R11/R10)\times[1+(R4/R3)]/(1+R5 \cdot j\omega C1)-(R4/R3)\}Vin$$

Here, when the resistances are selected such that R3=R4, R6=R7, R6'=R7', R8=R9, R10=R11, and R12=R13 are satisfied, the output voltage Vout of the adder 6 can be rewritten as follows:

$$Vout=\{[R5 \cdot j\omega C1-1)/(1+R5 \cdot j\omega C1)]-R1 \cdot j\omega(Cx+Cp)\}Vin \quad (10)$$

When the static capacitance element 14 is not connected to the signal line 13, i.e., when Cx=0, the amplitude of the output voltage of the capacitance-to-voltage converting unit 1 and the angular frequency, amplitude and phase of the AC signal output from the AC signal generator 4 are adjusted such that Vout in the equation (10) is zero. Substituting 0 into Vout (Vout=0) and 0 into Cx (Cx=0) in the equation (10) for finding a condition in which Vout is zero, the equation (10) can be rewritten as follows:

$$[(R5 \cdot j\omega C1-1)/(1+R5 \cdot j\omega C1)]-R1 \cdot j\omega Cp=0 \quad (11)$$

From this equation, $$R5C1=R1Cp \quad (12)$$

$$\omega=1/(R5C1R1Cp)^{1/2} \quad (13)$$

are derived. Thus, Vout can be made zero by adjusting R5, C1 and ω, so as to satisfy the equations (12) and (13) in a state in which the static capacitance element 14 is not connected to the signal line 13.

Next, when the static capacitance element 14 is connected to the signal line 13, the equation (10) can be rewritten as follows since the equations (11), (12) and (13) are satisfied as mentioned above:

$$Vout=VinR1 \cdot j\omega Cx \quad (14)$$

This equation (14) indicates that the output voltage Vout of the adder 6 is not influenced at all by any static capacitance other than the static capacitance Cx of the static capacitance element 14.

As described above in detail, since the static capacitance-to-voltage converter according to the second embodiment illustrated in FIGS. 7 and 8 also cancels a stray capacitance formed between the signal line 13 and the shielding line 15, and a stray capacitance formed between the exposed portion of the signal line 13 and its surroundings, it can output a voltage exactly corresponding to the static capacitance Cx of the static capacitance element 14 without suffering from the influence of such stray capacitances.

In the description heretofore made in connection with the static capacitance-to-voltage converter of FIG. 8, connecting the static capacitance element 14 having the static capacitance Cx to the signal line 13 is equivalent to a change in the static capacitance connected to the inverting input terminal of the operational amplifier AMP1 by Cx. Therefore, the static capacitance-to-voltage converter of FIG. 8 can also output a voltage exactly corresponding to $\Delta Cx$ when the static capacitance Cx of the static capacitance element 14 connected to the signal line 13 has changed by $\Delta Cx$. In the following, this operation will be described in detail.

The output voltage Vout of the adder 6 when the static capacitance element 14 is connected to the signal line 13 is expressed by the aforementioned equation (10). Assume that Vout is zero in this state. Conditions for satisfying this can be found by substituting 0 into Vout (Vout=0) in the equation (10):

$$R5C1=R1(Cx+Cp) \tag{15}$$

$$\omega=1/[R5C1R1(Cx+Cp)]^{1/2}=1/R5C1 \tag{16}$$

Stated another way, the output voltage Vout of the adder 6 can be made zero by adjusting the angular frequency C of the AC signal from the AC signal generator 4, R5 and C1 to satisfy the equations (15) and (16).

Next, the output voltage Vout of the adder 6, when the static capacitance Cx of the static capacitance element 14 has changed by $\Delta Cx$, can be expressed by substituting $Cx+\Delta Cx$ for Cx in the equation (10):

$$Vout=\{[R5 \cdot j\omega C1-1)/(1+R5 \cdot j\omega C1)]-R1 \cdot j\omega(Cx+\Delta Cx+Cp)\}Vin \tag{17}$$

Then, substituting the equations (15) and (16) into the equation (17), and giving Vout=0 in the equation (17):

$$Vout=-VinR1 \cdot j\omega \Delta Cx \tag{18}$$

This equation indicates that Vout exactly corresponds to $\Delta Cx$. This equation also indicates that the static capacitance-to-voltage converter of FIG. 8 is capable of outputting a voltage exactly corresponding to a change in capacitance of the static capacitance element 14 connected to the signal line 13.

While the foregoing description has also been made on the assumption that Vs=0 is satisfied, the same conclusion is derived also when Vs≠0, only except that associated calculations are more complicated. Alternatively, in FIGS. 7 and 8, a subtractor may be used in place of the adder 6 such that the subtractor is applied with the output of the first amplitude adjuster 3 and the output of the second amplitude adjuster 5 which are adjusted to have the same amplitude and the same phase.

Figure 9:
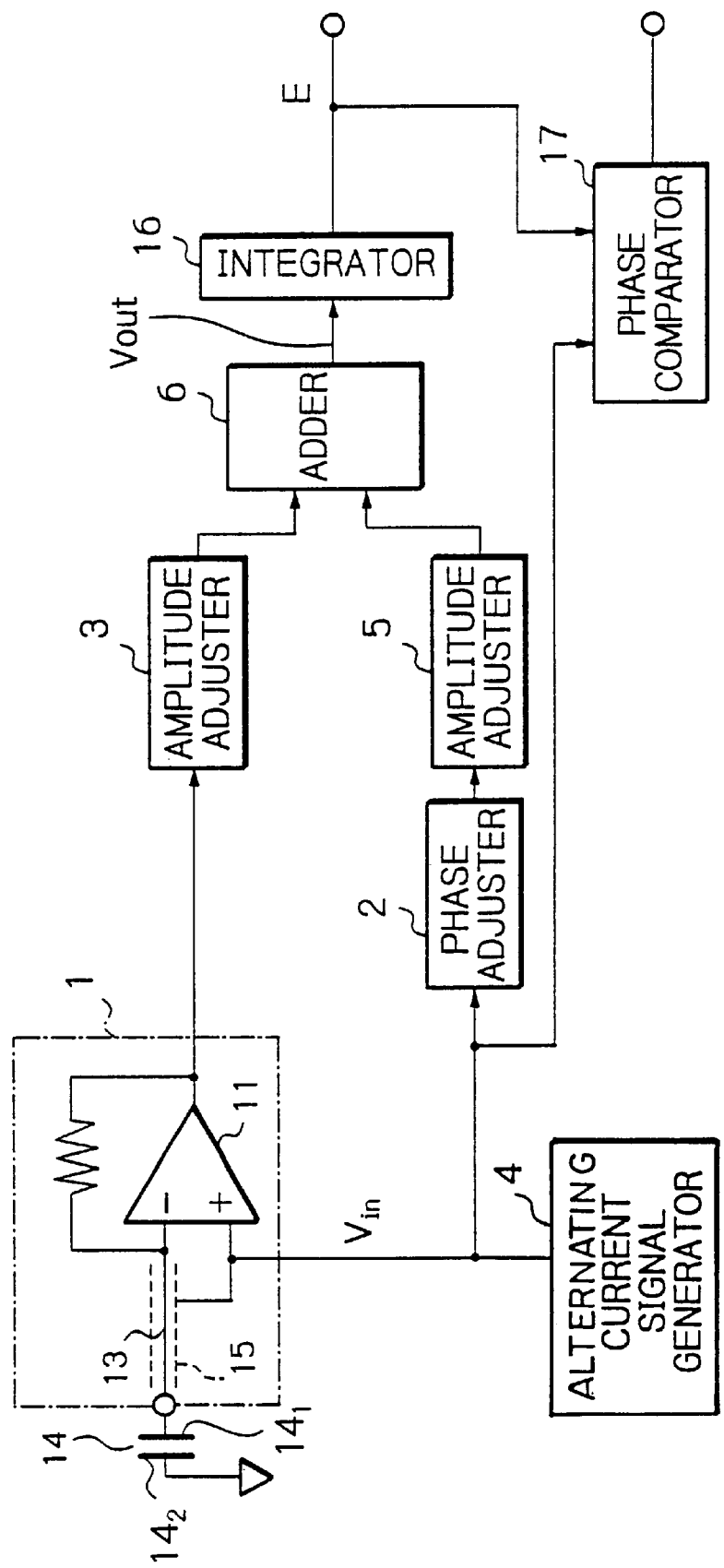
FIG. 9 is a block diagram illustrating the configuration of a capacitance meter which applies the static capacitance-to-voltage converter shown in FIG. 7.

FIG. 9 illustrates the configuration of a capacitance meter which applies the static capacitance-to-voltage converter illustrated in FIG. 7. This capacitance meter, similar to the capacitance meter illustrated in FIG. 5, has an integrator 16 connected to the adder 6, and outputs of the integrator 16 and the AC signal generator 4 connected to a phase comparator 17. While in the layout illustrated in FIGS. 3 and 4, high harmonic components of the AC signal Vin output from the AC signal generator 4 may be introduced into the phase adjuster 2 or the first amplitude adjuster 3, the introduction of such high harmonic components can be effectively prevented by disposing the phase adjuster 2 at a position illustrated in FIG. 9.

As stated above, the output voltage Vout of the adder 6 is expressed by the equations (14) and (18). By integrating this voltage by the integrator 16, it is possible to produce a voltage E which is proportional to the static capacitance Cx of the static capacitance element 14 or a change $\Delta Cx$ in the static capacitance Cx. Also, by using the phase comparator 17 to derive a difference in phase between the voltage E output from the integrator 16 and the AC signal Vin output from the AC signal generator 4, dielectric loss tangent can be derived for the static capacitance element 14.

In a manner similar to the capacitance meter of FIG. 5, the capacitance meter of FIG. 9 may also be designed such that one electrode $14_1$ of the static capacitance element 14 is used as a measuring electrode, and the other electrode $14_2$ is used as an object under measurement for which a determination is made as to whether it is good or bad based on the magnitude of a static capacitance Cx formed between the one electrode $14_1$ and the other electrode $14_2$. In this case, a housing for the capacitance meter is provided with a case having the same electric potential (voltage) as the operational amplifier 11. After the measuring electrode is accommodated in this case, the output voltage Vout of the adder 6 is adjusted to minimum or zero. In this event, if the measuring electrode is taken out of the case during a measurement, the adder 6 experiences a drift by a voltage proportional to a stray capacitance between the measuring electrode and its surroundings. Therefore, a static capacitance between the measuring electrode and the object under measurement can be more accurately measured by correcting the phase adjuster 2, the first amplitude adjuster 3 and the second amplitude adjuster 5 such that the drift value becomes minimum or zero. It is revealed from the foregoing that the capacitor meter of FIG. 9 is capable of measuring a very small static capacitance, as is the case of the capacitance meter of FIG. 5.

Figure 10:
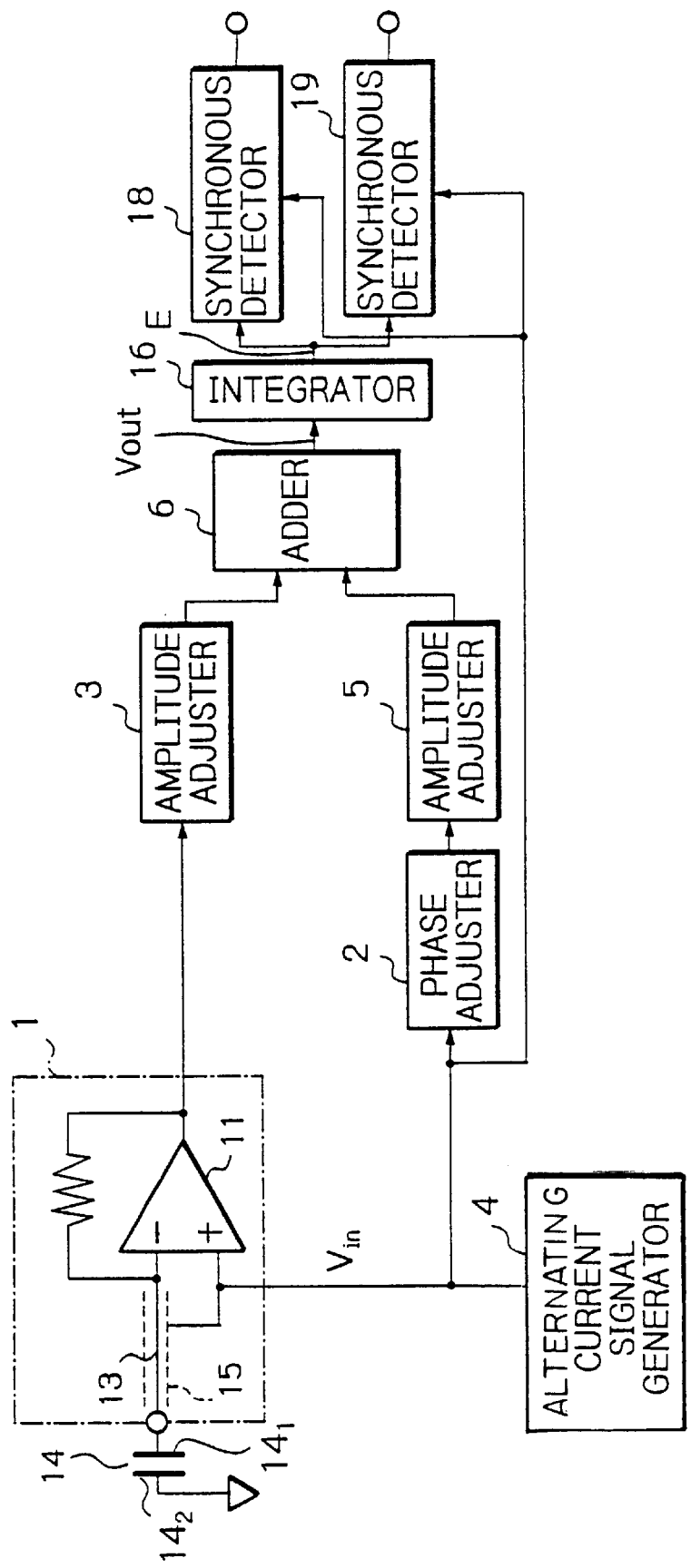
FIG. 10 is a block diagram illustrating an example of a modification to the capacitance meter shown in FIG. 9.
Figure 11:
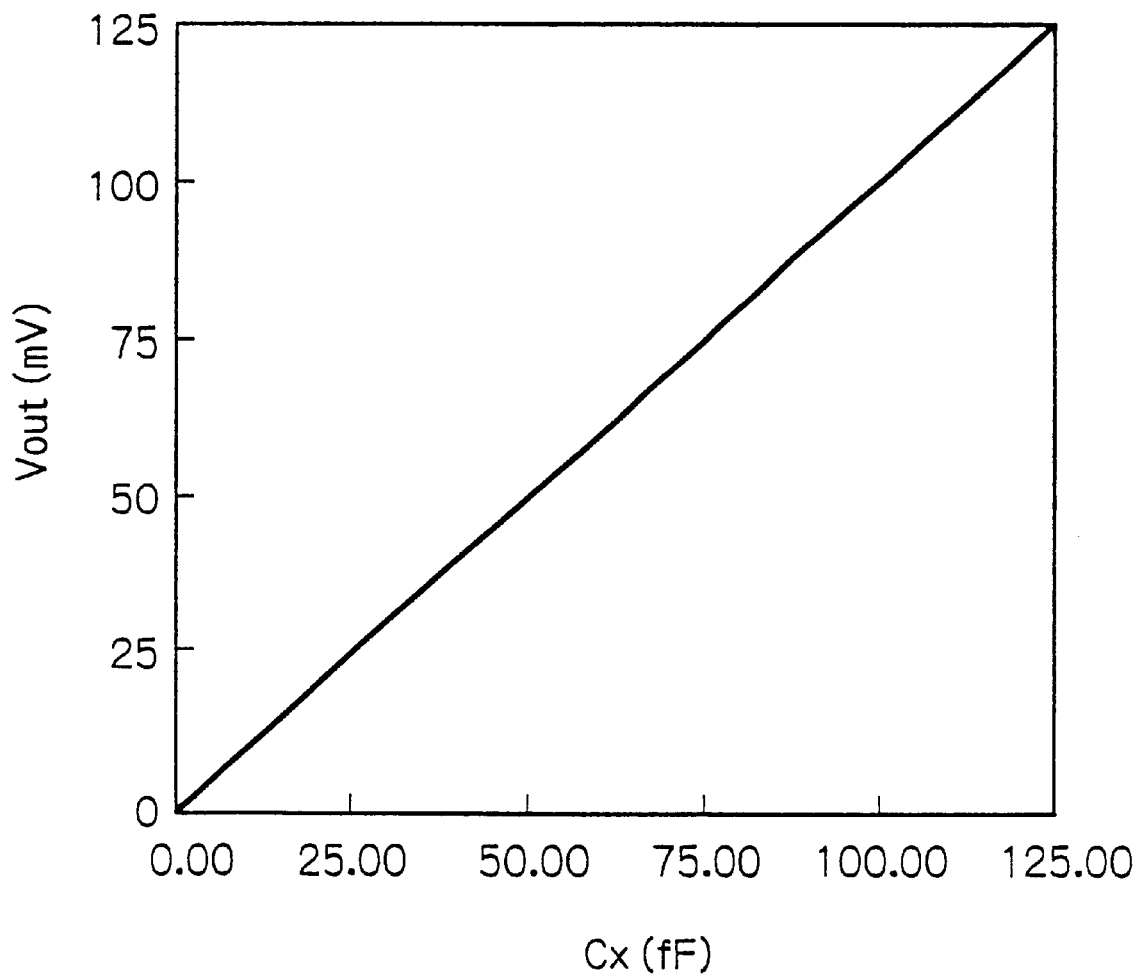
FIG. 11 shows an experimental result obtained from the example of a static capacitance-to-voltage converter shown in FIG. 4. In this example, suitable electric components are chosen in the electric circuits.

FIG. 10 is a block diagram generally illustrating an exemplary modification to the capacitor meter illustrated in FIG. 9, where the output of the integrator 16 in FIG. 9 is connected to a first synchronous detector 18 and a second synchronous detector 19, such that these synchronous detectors 18, 19 are applied with an AC signal Vin from an AC signal generator 4. When the first synchronous detector 18 synchronously detects a voltage E output from the integrator 16 with the AC signal Vin which is in phase with the voltage E, the static capacitance Cx of a static capacitance element 14 or a change $\Delta Cx$ in the static capacitance Cx can be derived as an output of the first synchronous detector 18. Similarly, when the second synchronous detector 19 synchronously detects the voltage E from the integrator 16 with the AC signal Vin which is out of phase by 90° from the voltage E, dielectric loss tangent for the static capacitance element 14 can be derived as an output of the second synchronous detector 19.

More specifically, the static capacitance Cx of the static capacitance element 14 can be derived by the first synchronous detector 18 as an average value or an integrated value of the voltage E over a range from 0° to 180° with respect to the phase of the AC signal Vin from the AC signal generator 4. Also, the dielectric loss tangent for the static capacitance Cx of the static capacitance element 14 can be derived by the second synchronous detector 19 as an average value or an integrated value of the voltage E over a range from 90° to 270° with respect to the phase of the AC signal Vin from the AC signal generator 14.

In the two embodiments described above, an example of the static capacitance element 14 having a static capacitance to be converted into a voltage may be a capacitive sensor which has one electrode connected to the inverting input terminal (−) of the operational amplifier AMP1 of the capacitance-to-voltage converting unit 1 through the signal line 13, and the other electrode (or a counterpart corresponding thereto) grounded, clamped at an appropriate bias electric potential (voltage), or opened in a space without being grounded. Such capacitive sensors may include all devices for detecting a static capacitance as well as known capacitive sensor such as an acceleration sensor, seismometer, pressure sensor, displacement sensor, displacement meter, proximity sensor, touch sensor, ion sensor, humidity sensor, rain drop sensor, snow sensor, lightening sensor, alignment sensor, touch failure sensor, shape sensor, end point detecting sensor, vibration sensor, ultrasonic sensor, angular velocity sensor, liquid amount sensor, gas sensor, infrared sensor, radiation sensor, level meter, freezing sensor, moisture meter, vibration meter, charge sensor and printed board tester. In addition, the present invention may also be applied to a clamp-type voltage meter or the like which measures a voltage in a contactless form.

Also, in the first and second embodiments, one electrode $14_1$ of the static capacitance element 14 may be used as a measuring electrode, while the other electrode $14_2$ is used as an object under measurement for which a determination is made as to whether it is good or bad based on the magnitude of a static capacitance Cx formed between the one electrode 141 and the other electrode $14_2$.

For the purpose of verifying the operation of the static capacitance-to-voltage converter, the static capacitance-to-voltage converter structured such as shown in FIG. 4 was formed to obtain a relation between the output voltage Vout (mV) and the static capacitance Cx (fF). As a result, a linear relation between Cx and Vout was obtained, and it was made sure that we could measure no more than 1–3 femtofarad, as shown in FIG. 4.

INDUSTRIAL APPLICABILITY

As will be apparent from the foregoing description with reference to the illustrated embodiments, the present invention produces the following effects:

(1) The static capacitance of a static capacitance element connected to a signal line can be converted into a voltage without suffering from the influence of a stray capacitance formed between the signal line and a shielding line surrounding the signal line or a stray capacitance formed between an exposed portion of the signal line and its surroundings to derive a voltage exactly corresponding to the static capacitance, thereby making it possible to make highly accurate conversion of the static capacitance of a static capacitance element into a voltage and detect the voltage even if the static capacitance is very small, for example, on the order of femtofarad (1/1000 of picofarad).

(2) Even if an electrode of a static capacitance element, which is not connected to a signal line, is biased at a certain electric potential (voltage), it is possible to produce a voltage exactly corresponding to the static capacitance of the static capacitance element.

(3) Since the static capacitance of a static capacitance element can be converted into a signal which includes the static capacitance and the frequency of an AC signal, the conversion of the static capacitance into a voltage and detection of the voltage can be achieved even if the AC signal has a low frequency under about 10 MHz.

What is claimed is:

1. A static capacitance-to-voltage converter comprising:

an operational amplifier having an inverting input terminal, a non-inverting input terminal and an output terminal, said operational amplifier having said output terminal and said inverting input terminal connected through a feedback resistor;

a signal line having one end connected to said inverting input terminal and the other end capable of being connected to a static capacitance element having a static capacitance;

a shield surrounding at least a portion of said signal line, and connected to said non-inverting input terminal;

an alternating current signal generator for applying said non-inverting input terminal with an alternating current signal; and an adjuster connected to the output terminal of said operational amplifier and an output terminal of said alternating current signal generator for adjusting an output of said static capacitance-to-voltage converter to minimum when no static capacitance element is connected to said signal line.

2. A static capacitance-to-voltage converter according to claim 1, further comprising integrator for integrating an output of said adjuster, wherein when a static capacitance is connected to the other end of said signal line, a signal corresponding to the static capacitance of said static capacitance is produced as an output of said integrator.

3. A static capacitance-to-voltage converter according to claim 2, further comprising comparator for comparing the phase of the output of said integrator with the phase of said alternating current signal, wherein when a static capacitance is connected to the other end of said signal line, a signal representative of dielectric loss tangent for the static capacitance of said static capacitance element is produced as an output of said comparator.

4. A static capacitance-to-voltage converter according to claim 2, further comprising first and second synchronous detectors for receiving the output of said integrator and said alternating current signal, said first synchronous detector outputting a signal representative of the static capacitance of said static capacitance, and said second synchronous detector outputting a signal representative of dielectric loss tangent for the static capacitance of said static capacitance.

5. A static capacitance-to-voltage converter according to claim 1, wherein said shield surrounds said signal line over the entire length thereof.

6. A static capacitance-to-voltage converter according to claim 1, wherein said static capacitance is a capacitive sensor.

7. A static capacitance-to-voltage converter according to claim 1, wherein said static capacitance comprises a measuring electrode connected to the other end of said signal line so that a static capacitance is formed between an object under measurement and said measuring electrode.

8. A static capacitance-to-voltage converter according to claim 7, further comprising a case placed at the same voltage as the non-inverting input terminal of said operational amplifier, for accommodating said measuring electrode when no static capacitance is connected to said signal line, wherein said adjuster adjusts the output of said static capacitance-to-voltage converter to minimum when said measuring electrode is accommodated in said case.

9. A static capacitance-to-voltage converter according to claim 1, wherein the feedback resistor directly connects the output terminal to the inverting input terminal.

10. A static capacitance-to-voltage converter according to claim 1, wherein the alternating current signal generator is directly connected to the non-inverting input terminal.

11. A static capacitance-to-voltage converter comprising:
an operational amplifier having an inverting input terminal, a non-inverting input terminal and an output terminal, and an output terminal, said operational amplifier having said output terminal and said inverting input terminal connected through a feedback resistor;
a signal line having one end connected to said inverting input terminal and the other end capable of being connected to a static capacitance element having a static capacitance;
a shield surrounding at least a portion of said signal line, and connected to said non-inverting input terminal;
an alternating current signal generator for applying said non-inverting input terminal with an alternating current signal;
a variable frequency generator of said alternating current signal; and
an adjuster for adjusting at least one of the amplitudes and phases of each of an output signal of said operational amplifier and said alternating current signal such that they are canceled with each other.

12. A static capacitance-to-voltage converter according to claim 11, wherein said adjuster comprises:
first adjuster for adjusting the amplitude of said alternating current signal;
second adjuster for adjusting the phase and amplitude of an output voltage from said operational amplifier such said output voltage has the same amplitude as and an opposite phase to an output of said first adjuster; and
an adder for adding the output of said first adjuster and an output of said second adjuster.

13. A static capacitance-to-voltage converter according to claim 11, wherein said adjuster comprises:
third adjuster for adjusting the amplitude of the output voltage of said operational amplifier;
fourth adjuster for adjusting the phase and amplitude of said alternating current signal such that said alternate current signal has the same amplitude as and an opposite phase to an output of said third adjuster; and
an adder for adding the output of said third adjuster and an output of said fourth adjuster.

14. A method of converting a static capacitance into a voltage comprising:
connecting one end of a signal line to a inverting input terminal, of an operational amplifier said signal line having at least a portion thereof surrounded by a shield;
placing said shield at the same potential as a non-inverting input terminal of said operational amplifier;
applying an alternating current signal to said non-inverting input terminal;
adjusting an output signal of said operational amplifier and said alternating current signal such that said output signal and said alternating current signal are canceled with each other when no static capacitance is connected to the other end of said signal line; and
connecting a static capacitance to the other end of said signal line, after said adjusting, to retrieve a voltage signal corresponding to the static capacitance of said static capacitance.

15. A method of converting a static capacitance into a voltage according to claim 14, wherein said adjusting an output signal of said operational amplifier and said alternating current signal such that said output signal and said alternating current signal are canceled with each other when no static capacitance is connected to the other end of said signal line comprises:
varying the frequency of said alternating current signal; and
adjusting the output signal of said operational amplifier and said alternating current signal in at least one of phase and amplitude such that said output signal and said alternating current signal are canceled with each other.

16. A method of converting a static capacitance into a voltage according to claim 15, wherein said adjusting an output signal of said operational amplifier and said alternating current signal such that said output signal and said alternating current signal are canceled with each other when no static capacitance is connected to the other end of said signal line comprises:
adjusting the amplitude of said alternating current signal;
adjusting the phase and amplitude of an output voltage from said operational amplifier such that said output voltage has the same amplitude as and an opposite phase to said alternating current signal having its amplitude adjusted; and
adding said alternating current signal having its amplitude adjusted, and the output voltage of said operational amplifier having its phase and amplitude adjusted.

17. A method of converting a static capacitance into a voltage according to claim 15, wherein said adjusting an output signal of said operational amplifier and said alternating current signal such that said output signal and said alternating current signal are canceled with each other when no static capacitance is connected to the other end of said signal line comprises:
adjusting the amplitude of an output voltage of said operational amplifier;
adjusting the phase and amplitude of said alternating current signal such that said alternating current signal has the same amplitude and an opposite phase to the output voltage of said operational amplifier having its amplitude adjusted; and
adding said output voltage having its amplitude adjusted and said alternate current signal having its phase and amplitude adjusted.

18. A method of converting a static capacitance into voltage according to claim 14, further comprises integrating said voltage signal to output a signal corresponding to said static capacitance.

19. A method of converting a static capacitance into a voltage according to claim 18, further comprises comparing the phase of said integrated signal with the phase of said alternating current signal to output a signal representative of dielectric loss tangent for said static capacitance.

20. A method of converting a static capacitance into a voltage according to claim 18, further comprising synchronously detecting said integrated signal with said alternating current signal to output a signal representative of the static capacitance and a signal representative of dielectric loss tangent for the static capacitance.

21. A method of converting a static capacitance into a voltage according to claim 14, wherein said shield is a shielding line surrounding said signal line over its entire length.

22. A method of converting a static capacitance into a voltage according to claim 14, wherein said static capacitance is a capacitive sensor.

23. A method of converting a static capacitance into a voltage according to claim 14, wherein said static capacitance comprises a measuring electrode so that a static capacitance is formed between an object under measurement and said measuring electrode.

24. A method of converting a static capacitance into a voltage according to claim 23, further comprising:

accommodating said measuring electrode in a case during measurement waiting time, said case being placed at the same voltage as a non-inverting input terminal of said operational amplifier; and performing a zero adjustment to cancel a stray capacitance formed between said measuring electrode and its ambient.

* * * * *

UNITED STATES PATENT AND TRADEMARK OFFICE
CERTIFICATE OF CORRECTION

PATENT NO.      : 6,331,780 B1                                                                 Page 1 of 1
DATED           : December 18, 2001
INVENTOR(S)     : Tatsuo Hiroshima, Koichi Nakano, Muneo Harada, Toshiyuki Matsumoto and
                  Yoshihiro Hirota It is certified that error appears in the above-identified patent and that said Letters Patent is hereby corrected as shown below:

<u>Title page,</u>
Item [73], add -- Hokuto Electronics, Inc. --

Signed and Sealed this

Twenty-second Day of October, 2002

*Attest:*

*Attesting Officer*

JAMES E. ROGAN
*Director of the United States Patent and Trademark Office*